United States Patent
O'Brien et al.

(10) Patent No.: US 6,200,910 B1
(45) Date of Patent: Mar. 13, 2001

(54) SELECTIVE TITANIUM NITRIDE STRIP

(75) Inventors: Sean O'Brien; Douglas A. Prinslow; James T. Manos, all of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/167,511

(22) Filed: Oct. 6, 1998

Related U.S. Application Data

(63) Continuation of application No. 08/670,381, filed on Jun. 25, 1996, now abandoned.

(51) Int. Cl.$^7$ ................................................. H01L 21/00
(52) U.S. Cl. ..................... 438/755; 438/648; 438/649; 216/100
(58) Field of Search ........................... 438/755, 648, 438/649; 216/100

(56) References Cited

U.S. PATENT DOCUMENTS

| 5,395,798 | * | 3/1995 | Havemann | 437/200 |
| 5,776,822 | * | 7/1998 | Fujii et al. | 438/586 |

FOREIGN PATENT DOCUMENTS

| 5-206133 | * | 11/1993 | (JP) | H01L/21/304 |

* cited by examiner

*Primary Examiner*—Randy Gulakowski
*Assistant Examiner*—Shamim Ahmed
(74) *Attorney, Agent, or Firm*—Carlton H. Hoel; Wade James Brady, III; Frederick J. Telecky, Jr.

(57) ABSTRACT

A strip for TiN with selectivity to $TiSi_2$ consisting of a water solution of $H_2O_2$ with possible small amounts of $NH_4OH$.

9 Claims, 2 Drawing Sheets

SELECTIVE TITANIUM NITRIDE STRIP

This application is a continuation of application Ser. No. 08/670,381, filed on Jun. 25, 1996 now abandoned.

BACKGROUND OF THE INVENTION

The invention relates to electronic semiconductor devices, and, more particularly, to fabrication methods for such devices.

Semiconductor integrated circuits with high device density require minimum size structures such as short gates and shallow source/drain junctions for field effect transistors ("FET"s), small area emitters for bipolar transistors, and narrow interconnection lines between devices. Short gates and narrow interconnection lines lead to higher resistance for the typical polysilicon gates and first level interconnection lines, and this increases RC time delays and slows circuit operation.

One approach to reduce the resistance of polysilicon gates and interconnection lines uses a self-aligned titanium silicide on top of the polysilicon. The silicidation process first deposits a blanket film of titanium metal and then reacts the titanium with any underlying silicon in a nitrogen atmosphere. Lastly, the process removes the titanium nitride formed from the titanium which did not become silicide. For example, see U.S. Pat. No. 4,821,085.

The removal of titanium nitride in this self-aligned silicide process requires a very high selectivity with respect to removal of the titanium silicide, otherwise the titanium silicide will be thinned and lose the advantages of siliciding. The removal of titanium nitride with the standard basic SC1 solution (12.5% ammonium hydroxide solution, 12.5% hydrogen peroxide solution, and 75% water) at room temperature has a selectivity with respect to titanium silicide of roughly 7.8 to 1. This low selectively presents problems in the known silicide processes.

SUMMARY OF THE INVENTION

The present invention provides a highly selective etch of titanium nitride and titanium metal with respect to titanium silicide by the use of a solution with a large hydrogen peroxide to ammonium hydroxide ratio.

Further, the present invention provides a self-aligned silicide process which selectively removes titanium nitride with respect to titanium silicide with a hydrogen peroxide solution and then removes titanium silicide filaments after a phase conversion anneal with a hydrogen peroxide plus ammonium hydroxide solution.

Advantages of the invention include a simple method for removal of titanium nitride with high selectivity with respect to titanium silicide and a simple self-aligned silicide process.

BRIEF DESCRIPTION OF THE DRAWINGS

The drawings are heuristic for clarity.

DESCRIPTION OF THE PREFERRED EMBODIMENTS

Overview

Figure 1A:
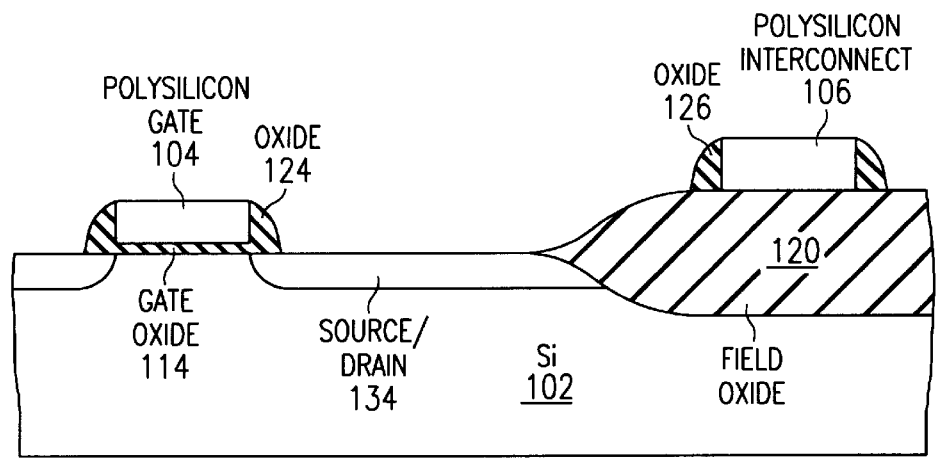
FIGS. 1a–d illustrate in cross sectional elevation views steps of a first preferred embodiment method.
Figure 1B:
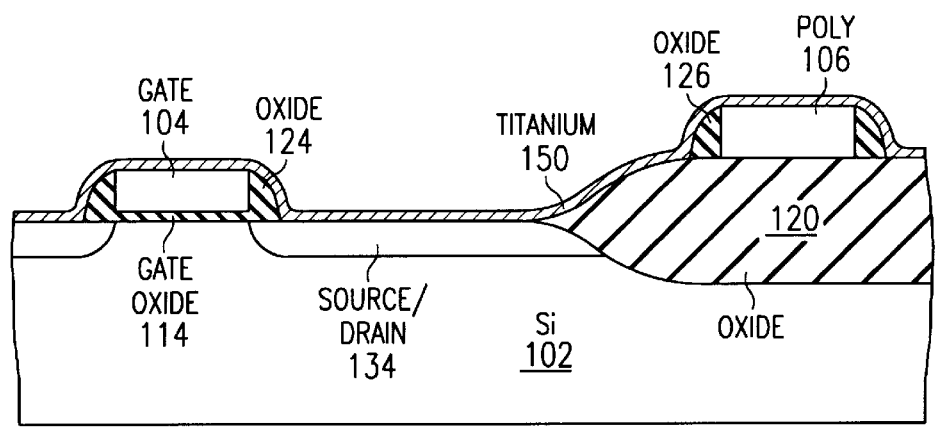

The preferred embodiment methods strip titanium nitride (TiN) and titanium metal (Ti) selectivity (20-to-1) with respect to titanium silicide ($TiSi_2$) with essentially a 30% hydrogen peroxide ($H_2O_2$) solution in water. Stripping with solution temperatures of about 55° C. gives practical etch rates.

Some etching of $TiSi_2$ may be desired, such as removal of unwanted filaments which form during the siliciding process. Some preferred embodiments thus include a second strip with a solution containing both $H_2O_2$ and ammonium hydroxide ($NH_4OH$) to be applied after the anneal which converts small grain C49 phase $TiSi_2$ to large grain C54 phase $TiSi_2$. Narrow filaments convert very slowly and the solution selectively strips C49 phase with respect to C54 phase.

First preferred embodiment

FIGS. 1a–d illustrate in cross sectional elevation views the first preferred embodiment self-aligned titanium silicide method which includes the following steps.

(1) Start with silicon substrate 102 having polysilicon gate 104 on gate insulator silicon dioxide (gate oxide) 114 with gate 104 having sidewall oxide 124 for alignment of source/drains 134 and with field oxide 120 for transistor isolation. Also, polysilicon interconnect line 106 with sidewall oxide 126 may run over field oxide 120. Typically, the polysilicon gates and the field oxide each extend about 0.3 μm above the substrate surface, so the top of poly interconnect 108 lies about 0.6 μm above the substrate surface. Gate oxide 114 may be about 6 nm thick and source/drains 134 about 0.15 μm deep. See FIG. 1a which illustrates a gate length and poly interconnect width of roughly 0.5 μm.

(2) Sputter deposit titanium 150 to a thickness of about 60 nm. Titanium 150 coverage on the sloping sidewall oxides 124–126 and field oxide 120 is not crucial because this portion of titanium 150 will not form $TiSi_2$ and will be stripped. See FIG. 1b.

(3) Insert the titanium coated substrate into a nitrogen (plus optional hydrogen) atmosphere and raise the temperature to roughly 600° C. to drive the silicidation reaction for the portion of titanium 150 abutting silicon; namely, the surfaces of gate 104, poly interconnect 106, and source/drain 134:

$$Ti + 2Si \rightarrow TiSi_2$$

Silicon diffuses through $TiSi_2$, so the $TiSi_2$ grows from gate 104, poly 106, and source/drain 134. (This $TiSi_2$ is the metastable C49 phase and will be converted to the stable C54 phase in a later anneal.) A competing reaction with the nitrogen from the atmosphere diffusing into the titanium limits the $TiSi_2$ growth:

$$Ti + \tfrac{1}{2}N_2 \rightarrow TiN$$

The titanium on oxides 120, 124, and 126 only slightly reduces the abutting oxide before nitrogen diffusing from the atmosphere will convert the titanium to TiN. Thus only a small amount of titanium oxide forms:

$$Ti + SiO_2 \rightarrow TiO_2 + Si$$

Figure 1C:
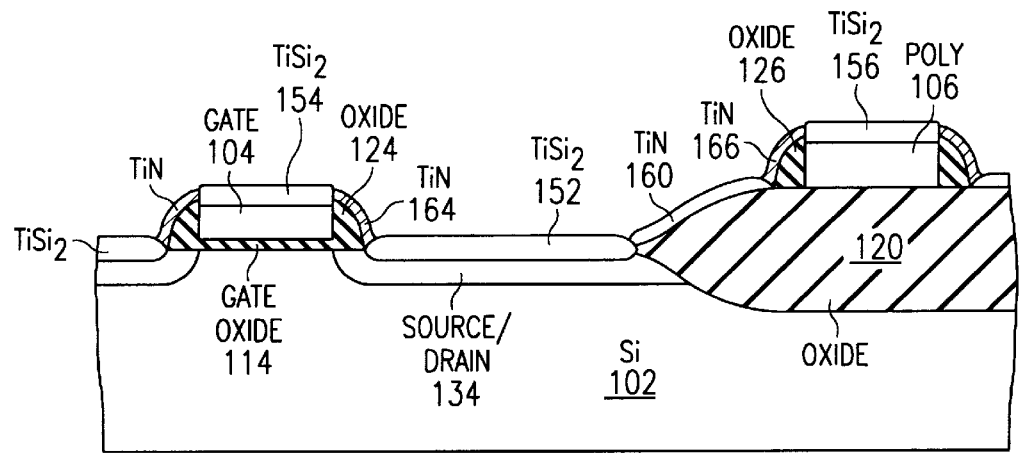
Figure 1D:
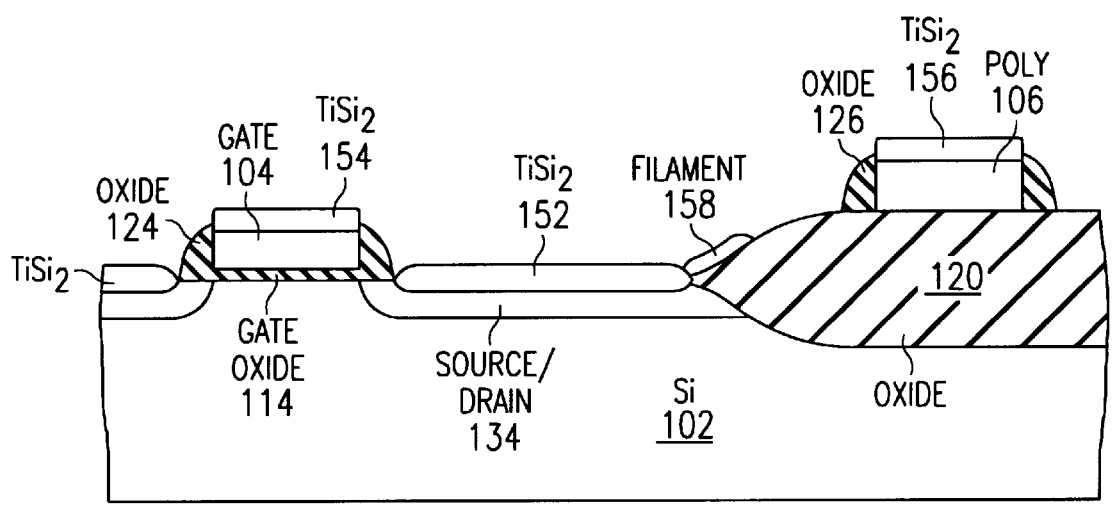

And some titanium remains unreacted as Ti metal. See FIG. 1c showing $TiSi_2$ 152 formed on source/drain 134, $TiSi_2$ 154–156 formed on gate 104 and poly 106, and TiN 160–164–166 formed on oxides 120–124–126. The top surfaces of $TiSi_2$ 152–154–156 typically contain some TiN which forms prior to the diffusing silicon arriving to form silicide. The $TiSi_2$ will be roughly 80 nm thick and the TiN roughly 60 nm thick. Thus the selectivity of only 7.8 to 1 for SC1 stripping of the TiN with a 100% overetch would remove roughly 15 nm of $TiSi_2$, or about 20%.

(4) Immerse the silicided/nitrided substrate in a solution of 30% $H_2O_2$ and 70% $H_2O$ at 55° C. for roughly 15 minutes. This solution has an etch rate for TiN of about 8 nm/min, so the 15 minute etch equals a 100% overetch. The selectivity with respect to $TiSi_2$ roughly equals 35 to 1 (a $TiSi_2$ etch rate of roughly 0.25 nm/min), so the TiN strip removes roughly 4 nm of $TiSi_2$, or 5%. $H_2O_2$ also strips any residual Ti metal and thin $TiO_2$ on oxides 120–124–126. See FIG. 1d.

(5) Lastly, rinse the silicided substrate clean and then anneal in a forming gas (nitrogen plus hydrogen) atmosphere at about 750° C. to convert the $TiSi_2$ from metastable C49 phase to stable C54 phase and thereby lower the resistivity from roughly 75 microohm-cm to roughly 15 microohm-cm. This completes the siliciding, and further steps of forming metal level interconnections, passivation, wire bonding, and packaging complete the integrated circuit.

Graphical representation

Figure 2:
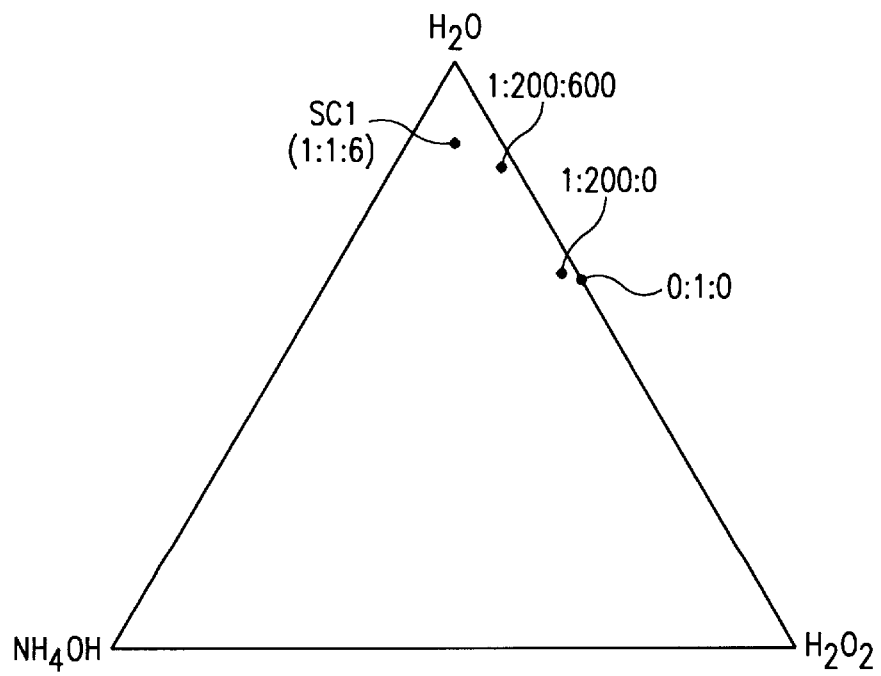
FIG. 2 is a component diagram showing various solutions.

The preferred embodiment stripping solution may be modified while retaining high selectivity of TiN with respect to $TiSi_2$. In particular, FIG. 2 is a component diagram graphically showing the portions of each of the three components ($NH_4OH$, $H_2O_2$, and $H_2O$) of possible stripping solutions. Recall that $NH_4OH$ is typically provided as a 29% by weight solution with water (also expressed as 14% by weight $NH_3$) and that $H_2O_2$ is typically provided as a 30% by weight solution with water. Thus the point labelled SC1 in FIG. 2 depicts a solution with a volume ratio of 1:1:6 of 29% $NH_4OH$ solution to 30% $H_2O_2$ solution to $H_2O$. Similarly, the other data points in FIG. 2 have labels reflecting their volume ratios of 29% $NH_4OH$ solution to 30% $H_2O_2$ solution to $H_2O$, respectively. The following table shows the TiN etch rate and selectivity with respect to $TiSi_2$ (C49 phase) of these solutions.

| Solution | TiN etch rate (nm/min) | Selectivity |
|---|---|---|
| 1:1:6(SC1) at 27° C. | 5.7 | 7.8 |
| 1:200:600 at 27° C. | 3.5 | 11.3 |
| 1:200:600 at 55° C. | 13 | 11.0 |
| 1:200:0 at 55° C. | 28 | 20.1 |
| 1:200:0 at 40° C. | 6.7 | 16.6 |
| 0:1:0 at 55° C. | 8.0 | 35 |

The first two entries show a replacement of almost all of the $NH_4OH$ by $H_2O_2$ in SC1 at room temperature decreases the TiN etch rate but increases selectivity somewhat. The second and third entries indicate a temperature independent selectivity but increased TiN etch rate for the $NH_4OH$ mostly replaced by $H_2O_2$ in SC1. The third and fourth entries show increasing $H_2O_2$(and minimal $NH_4OH$) concentration increases TiN etch rate plus nearly doubles the selectivity. The fourth and fifth entries shows a small temperature increase in selectivity but large increase in TiN etch rate. And the fourth plus sixth entries illustrate elimination of all $NH_4OH$ decreases TiN etch rate by a factor of more than 3 but almost doubles selectivity. In summary, limiting or omitting the metal-complexing ammonium ion provides a tradeoff of decreased etch rates of both TiN and $TiSi_2$ but increased selectivity of etching TiN over $TiSi_2$. And a temperature increase can compensate for the decrease in etch rate of TiN. Thus a selectivity can be picked and the etch rate adjusted by temperature. For example, replacing almost all of the ammonia of SC1 with peroxide (i.e., the 1:200:600 solution) yields better than a 10 to 1 selectivity, and then removing water from this solution (i.e., the 1:200:0 solution) raises the selectivity to better than 20 to 1 at 55° C.

Second preferred embodiment

A second preferred embodiment method follows steps (1)–(5) of the first preferred embodiment but adds a $TiSi_2$ filament strip with SC1 after the annealling in step (5). That is, anneal to convert $TiSi_2$ from higher resistivity metastable C49 phase to lower resistivity stable C54 phase, and then strip unconverted $TiSi_2$ remaining in the C49 phase by immersing in a solution of SC1 at room temperature. SC1 readily etches C49 phase (about 0.73 nm/min) but does not detectibly etch the C54 phase $TiSi_2$. $TiSi_2$ 152–154–156 on the gates, lines, and source/drains will generally be C54 phase, but narrow filaments (e.g., filament 158 in FIG. 1d) of $TiSi_2$ on oxides 120, 124, or 126 would be too narrow to convert to C54 phase during the anneal and remain as C49 phase which is etched away by SC1 in a few minutes. Indeed, the C49 grains may average about 0.1–0.2 μm diameter; and the phase conversion time (time to convert half from C49 to C54) roughly depends upon $g^2/(w-g)$ where g is the grain size and w is the filament width. So narrow filaments have a very long conversion time.

The delay of the $TiSi_2$ filament etch until after the phase change anneal (rather than at the same time as the TiN strip) allows the use of the highly selective $H_2O_2$ TiN strip and consequent minimal loss of $TiSi_2$ on the gates, lines, and source/drains.

Third preferred embodiment

Because the selectivity of etching TiN relative to $TiSi_2$ increases with decreasing $NH_4OH$ and the etch rate increases with increasing $H_2O_2$ concentration, the third preferred embodiment uses a solution of greater than 30% $H_2O_2$ without any $NH_4OH$. Indeed, $H_2O_2$ is a liquid with melting point about 0° C. and boiling point about 150° C. and miscible with water, so any concentration can be achieved.

Modifications and variations

The preferred embodiments may be varied in many ways while retaining one or more of the features of a TiN strip selective to $TiSi_2$.

For example, the temperatures and concentrations of the strip solutions may be varied provided the desired selectivity is maintained, such as at least 10 to 1 or at least 20 to 1 in the titanium nitride strip; the selectivity of C49 phase to C54 phase etching is easily maintained. Further, the thicknesses and widths of the titanium layer and resulting reaction product TiN and $TiSi_2$ may be varied; the reaction temperature may be varied and include rapid thermal annealing; the phase conversion temperature may be vaired.

What is claimed is:

1. A method of selective stripping of exposed titanium nitride and exposed titanium metal with respect to exposed titanium silicide which comprises the steps of:

(a) providing a water solution of hydrogen peroxide and ammonium hydroxide at a temperature of from 40° C. to about 55° C.

(b) having a ratio of ammonium hydroxide to hydrogen peroxide of less than about 1/200;

(c) providing a body containing thereon titanium silicide and at least one of titanium nitride or titanium metal; and (d) immersing said body into said solution to selectively remove said titanium nitride and/or titanium metal selective to said titanium silicide.

2. The method of claim 1 wherein said solution contains about 30 percent hydrogen peroxide.

3. A method of selective stripping of exposed C49 phase titanium silicide with respect to exposed C54 phase titanium silicide which comprises the steps of:

(a) providing a water solution of hydrogen peroxide and ammonium hydroxide at a temperature of from 40° C. to about 55° C.
(b) having a ratio of ammonium hydroxide to hydrogen peroxide of less than about 1/200;
(c) providing a body containing thereon C49 titanium silicide and C54 phase titanium silicide; and
(d) immersing said body into said solution to selectively remove said C49 phase titanium silicide selective to said C54 phase titanium silicide.

4. The method of claim 3 wherein said solution contains about 30 percent hydrogen peroxide.

5. A method of selective stripping of exposed titanium nitride and/or exposed titanium metal with respect to exposed titanium silicide which comprises the steps of:
(a) providing a water solution of hydrogen peroxide at a temperature of from 40° C. to about 55° C.;
(b) providing a body containing thereon titanium silicide and at least one of titanium nitride or titanium metal; and
(d) immersing said body into said solution to selectively remove said titanium nitride and/or titanium metal selective to said titanium silicide.

6. The method of claim 5 wherein said solution contains about 30 percent hydrogen peroxide.

7. A method of selectively stripping C49 phase titanium silicide relative to C54 phase titanium silicide which comprises the steps of:
(a) providing a water solution of hydrogen peroxide at a temperature of from 40° C. to about 55° C.;
(b) providing a body containing thereon C49 phase titanium silicide and C54
(c) phase titanium silicide; and
(d) immersing said body into said solution to selectively remove said C49 phase titanium silicide selective to said C54 phase titanium silicide.

8. The method of claim 7 wherein said solution contains about 30 percent hydrogen peroxide.

9. A method of stripping TiN, comprising the steps of:
(a) providing a substrate with exposed portions of TiN; and
(b) immersing said substrate in a water solution of hydrogen peroxide and ammonium hydroxide with a ratio of ammonium hydroxide to hydrogen peroxide of less than about 1/200 at a temperature of from 40° C. to about 55° C. to strip said TiN from said substrate.

* * * * *